United States Patent
Arabi et al.

(10) Patent No.: US 9,824,773 B1
(45) Date of Patent: Nov. 21, 2017

(54) APPARATUS AND METHOD TO ADJUST POWER AND PERFORMANCE OF INTEGRATED CIRCUITS

(75) Inventors: Karim Arabi, West Vancouver (CA); Scott Muma, Coquitlam (CA); Nick Rolheiser, Ottawa (CA); Norbert Diesing, Surrey (CA)

(73) Assignee: MICROSEMI STORAGE SOLUTIONS, INC., Aliso Viejo, CA (US)

(*) Notice: Subject to any disclaimer, the term of this patent is extended or adjusted under 35 U.S.C. 154(b) by 704 days.

(21) Appl. No.: 13/159,330

(22) Filed: Jun. 13, 2011

Related U.S. Application Data

(63) Continuation of application No. 12/129,408, filed on May 29, 2008, now abandoned.

(51) Int. Cl.
  *G06F 1/32* (2006.01)
  *G11C 29/12* (2006.01)

(52) U.S. Cl.
  CPC ............ *G11C 29/12* (2013.01); *G06F 1/3206* (2013.01)

(58) Field of Classification Search
  CPC .... G11C 29/12; G06F 2217/78; G06F 1/3206
  USPC .................................................. 713/300, 320
  See application file for complete search history.

(56) References Cited

U.S. PATENT DOCUMENTS

| | | | |
|---|---|---|---|
| 6,694,492 B1 * | 2/2004 | Shakkarwar | G01R 31/3172 257/E21.525 |
| 7,100,058 B1 * | 8/2006 | Tomlinson et al. | 713/300 |
| 7,112,978 B1 * | 9/2006 | Koniaris et al. | 324/750.3 |
| 7,142,009 B1 * | 11/2006 | Watt | H03K 19/0008 326/38 |
| 7,248,533 B2 * | 7/2007 | Aimoto | 365/227 |
| 7,812,582 B2 * | 10/2010 | Chua-Eoan et al. | 323/282 |
| 2004/0183588 A1 * | 9/2004 | Chandrakasan et al. | 327/545 |
| 2007/0200593 A1 * | 8/2007 | Agarwal et al. | 326/38 |
| 2008/0174295 A1 * | 7/2008 | Lee | 323/318 |
| 2008/0209285 A1 * | 8/2008 | Acharyya et al. | 714/724 |
| 2009/0072857 A1 * | 3/2009 | Perisetty | H03K 19/0016 326/38 |
| 2009/0278567 A1 * | 11/2009 | Suzuki | 326/80 |

* cited by examiner

*Primary Examiner* — Nitin Patel
*Assistant Examiner* — Brandon Kinsey
(74) *Attorney, Agent, or Firm* — Glass & Associates; Kenneth Glass

(57) ABSTRACT

The voltage applied to an integrated circuit is scaled so as to account for variations in the manufacturing processes, temperature, and the like, and to allow for power/performance optimization of the integrated circuit. The integrated circuit may characterized during a manufacturing test or anytime thereafter. The characterization data, which reflects the performance and power consumption of the integrated circuit, is used to determine an associated processing/speed bin, which in turn, defines the voltage that will be applied to the integrated circuit during normal operation. Optionally, a number of different supply voltages are applied to different circuit blocks disposed in the same integrated circuit. Each such circuit block may have a different characterization data associated with a different supply voltage.

17 Claims, 3 Drawing Sheets

APPARATUS AND METHOD TO ADJUST POWER AND PERFORMANCE OF INTEGRATED CIRCUITS

BACKGROUND OF THE INVENTION

The present invention relates to integrated circuits (IC), and more particularly to controlling the power consumption and performance of ICs.

Much of the effort in the development of integrated circuits has been directed towards increasing speed and decreasing size. The optimization of circuit speed has often come at the expense of other factors, such as power consumption.

The increasing use of integrated circuits in electronic equipment and handheld device has seen a parallel rise in demand for increasing the energy efficiency and reducing power consumption of the integrated circuits. The growth in demand for battery-operated portable electronic devices, such as cellular phones or personal organizers, has brought to the fore the dual requirements of reducing the power consumption while maintaining or enhancing operational performance of the integrated circuits (hereinbelow, alternatively referred to as chip) disposed in such devices. Efforts to reduce power consumption and enhance performance should not result in a significant increase in development or manufacturing costs. Currently, the requirement for lower power consumption is driven either by cost in order to accommodate the chip in a cheaper package, or by the market forces requiring compliance with the Energy Star specifications. Chips targeting hand-held markets need to consume relatively very low power both in the idle mode and in operation so as to extend the battery lifetime.

Low power VLSI design is important for the dual purposes of reducing the power consumption and power dissipation. Power consumption and power dissipation are two different facets of the same phenomenon. Minimizing power consumption is necessary to extend the battery life in mobile applications, while minimizing power dissipation is important to ensure reliable device operation and use of cheaper packages.

The need for low-power design is also becoming a factor in high-performance digital systems, such as microprocessors and digital signal processors (DSP's) that operate at relatively high frequencies. Typically, the power dissipation of an IC, and its temperature increase linearly with the clock frequency. The dissipated heat must be directed away from the chip to keep its temperature at an acceptable level. Therefore, the packaging, cooling and heat removal are all factors that contribute to the cost.

Low power consumption has many advantages for non-portable products as well. For example, lowering the power consumption, enables the use of cheaper and lighter power supplies, less expensive IC packages, and simpler power distribution networks. Conventional power management techniques are generally directed to idle states. Once in an idle state, an IC or system may be placed in a sleep or standby mode, or alternatively may be switched off. While in such a mode, for each application that is running, a minimum performance level may be set in the Operating System (OS), to maintain the expected Quality of Service (QoS).

Efforts directed at achieving low power consumption in, for example, digital systems span a wide range of techniques, from device/process techniques to algorithm techniques. Device characteristics (e.g., threshold voltage), device geometries and interconnect properties are significant factors in lowering the power consumption. Circuit-level techniques, such as reducing the voltage swing or clocking strategies, can be used to reduce power dissipation at the transistor level. Architectural techniques include smart power management of various system blocks, utilization of pipelining and parallelism, and design of bus structures. The power consumed by the system may be reduced by the proper selection of the data processing algorithms to minimize the number of switching events for a given task.

Existing power management techniques typically focus on the Operating System (OS), firmware, and monitoring of the data activity and performance. Such techniques are generally closed-loop and require continuous adjustment during operation. In accordance with the well known Dynamic Frequency Scaling (DFS) technique, the frequency of the voltage island, or islands is/are reduced. DFS reduces peak power and thus enables the use of cheaper packages. In accordance with the well known Dynamic Voltage and Frequency Scaling (DVFS) technique, both the frequency and applied voltage are reduced. The DVFS technique reduces power consumption which has a quadratic relationship with the applied voltage. The DVFS is normally applied in a closed-loop manner by monitoring the data activity and other processes in real time and adapting the applied voltage to improve performance. Both DFS and DVFS techniques require changes in the frequency and thus can not be used in ICs required to operate at a certain frequency. In other words, neither DFS or DVFS can be used in ICs that are required to operate at a given frequency.

U.S. Pat. No. 7,240,223 appears directed at a dynamic power management technique using an operating system (OS) that causes a processor to operate in one of multiple run states with different performance and/or power dissipation levels. The OS selects the run state in response to processor information (e.g., processor load) being monitored by the OS. The OS can (i) predict future states of the processor information based on sampled processor information, (ii) take an average of the predicted and actual samples for comparison with a threshold to select a run state, (iii) track the number of consecutive saturated samples that occur during a selected window of samples, and (iv) predict future processor information samples based on the number of consecutive saturated samples.

U.S. Pat. No. 6,845,456 appears directed at a computer system that has multiple performance states. The system periodically obtains utilization information for a multitude of tasks running on the processor and determines processor utilization according to the utilization information for the tasks. The system compares the processor utilization to at least one threshold and selectively adjusts the processor performance according to the comparison result.

U.S. Pat. No. 7,230,602 appears directed at a source driver having a logic speed monitoring unit, an internal logic voltage generator, a substrate voltage generator, a substrate leakage-current monitoring unit, and a power management control unit for adjusting voltage using the speed data. By monitoring the logic operation speed of an internal logic circuit in the source driver, in accordance with the change of the operation frequency, the power is dynamically adjusted so as to optimize the power consumption and the operation speed. In the standby mode, adjusting the substrate voltage further reduces the power consumption. The substrate voltage can also be adjusted according to the substrate leakage current of the source driver.

U.S. Pat. No. 6,519,707 appears directed at a system that includes a processor, a voltage regulator, and a memory. The voltage regulator is coupled to the processor to adjust the operating voltage of the processor. The memory stores processor instructions that, when executed by the processor, result in modification of the operating frequency of the processor and adjustment of the operating voltage of the processor based on the dynamic changes in the processing load of the processor and traffic changes.

U.S. Pat. No. 7,100,058 appears directed at a programmable power management integrated circuit that includes analog input monitors that receive analog input signals corresponding to voltage, current, or temperature measurements. The programmable logic device controls FET drivers that can turn on/off the power applied to the monitored system. The programmable power management integrated circuit may also include an internal oscillator, a serial interface, an in-system programmable interface, a JTAG interface, a memory that stores identification information, and a register for capturing system information during power-down. The applied power is not adjusted and is instead either turned on or turned off.

U.S. Pat. No. 7,117,378 appears directed at a digital circuit that includes a digital processing component, and power supply adjustment circuitry. The digital processing component is capable of operating at a number of clock frequencies. The maximum delay time of a critical path in the digital processing component is determined by the level of supplied voltage. The power supply adjustment circuitry is operable to receive a first clock signal and adjust the level of the supplied voltage such that the maximum delay time of the critical path of the digital processing component is less than a pulse-width duration between a first clock edge of the first clock signal and a second clock edge of the first clock signal immediately following the first clock edge. The voltage is adjusted using a closed-loop technique.

U.S. Pat. No. 6,535,735 appears directed at maintaining the stability of a closed-loop system in which process variation is handled by assuming a worst case propagation delay of the critical path, and designing the clock frequency and minimum power supply voltage of the circuit to ensure proper operation under worst case conditions. Instead of assuming a worst case propagation delay of the critical path, the propagation delay may be measured in an actual circuit path that has been constructed to be the equivalent to, or slightly worse than, the propagation delay of the critical path. By knowing the actual worst case propagation delay, the circuit may be modified to operate with lower power supply voltages or have its clock frequency operate at or near the circuit's actual worst case limit. Such modifications of power supply voltage and/or clock frequency may occur during circuit operation and adapt to the different operating parameters of each circuit.

U.S. Pat. No. 7,061,292 appears directed at a system that includes a device having a critical path delay, a control logic responsive to output from the path delay and operative to generate a controlled output, and a power converter operative to adjust the supply voltage in response to the generated controlled output. The critical path delay, the control logic, and the power converter cooperate to provide first order bang-bang control of the critical path delay.

U.S. Pat. No. 7,134,031 appears directed at a multiprocessing system that measures the degree of parallelism achieved in executing program instructions, and uses this information to dynamically control the clock speeds and voltage levels applied to different processor cores in order to reduce the overall amount of energy consumed.

U.S. Patent Application Publication No. 2002/0083356 appears directed at a system that dynamically transitions a processor between two performance states, high performance and low power. Predetermined core clock frequency and supply voltage levels of the processor define each performance state. Transitioning the supply voltage while the processor is in the active mode and transitioning the frequency while the processor is in the sleep mode appears to reduce the processor latency.

As is well known, the statistical process parameters inherent in any IC manufacturing processes result in variations in the speed and performance of the IC. The speed distribution of the manufactured ICs has a nearly Gaussian distribution. The power specification is often determined by fast ICs which have the highest power dissipation. The performance specification, on the other hand, is determined by the slow ICs which often have the lowest power dissipation. The spread between the slow and fast ICS, referred to as the performance gap, is widening as the drive toward sub-micron processing technologies continues.

BRIEF SUMMARY OF THE INVENTION

In accordance with one embodiment of the present invention, a method for scaling the voltage used to power an integrated circuit (IC) includes, in part, characterizing the IC to collect characterization data. The characterization data is subsequently correlated and associated with one of a multitude of supply voltages. The voltage associated with the characterization data is used to power up the IC. In one embodiment, a number of different voltages are applied to different circuit blocks disposed in the same IC. Each such circuit block may have a different characterization data associated with a different supply voltage.

In one embodiment, the characterization data, or data representative thereof, together with the associated supply voltages are stored in one or more memory. The memory is loaded with such data after the characterization process is completed. The memory may be internal or external to the IC. In one embodiment, the characterization data accounts for both manufacturing process as well as temperature variations. In one embodiment, the process characterization is carried out using one or more ring oscillators selectively disposed along one or more critical paths of the IC or its circuit blocks. In another embodiment, the process characterization is carried out using at-speed scan vectors.

DETAILED DESCRIPTION OF SPECIFIC EMBODIMENTS

In accordance with one embodiment of the present invention, the voltage applied to a circuit is scaled so as to account for variations in the manufacturing processes, temperature, and the like, and to allow for power/performance optimization of the circuit. To achieve this, the circuit is characterized during a manufacturing test or anytime thereafter. The characterization data, which reflects the performance and power consumption of the circuit, is used to determine a processing/speed bin associated with the circuit. The associated processing/speed bin, in turn, defines the voltage that will be applied to the circuit during operation.

To determine the process variations signature and characterize an IC, in accordance with one exemplary embodiment, one or more ring oscillators are disposed along the critical path(s) of the IC. The ring oscillators are used during a testing operation to characterize the IC and determine the associated process/speed bin of the IC. The oscillation frequency of a ring oscillator varies according to the process parameters, such as gate length, gate oxide thickness, threshold voltage implant, and the like, used during manufacturing of the IC. For example, as is known, the shorter the channel length of an MOS transistor, or the thinner its gate oxide, the faster the transistor switches on and off. Associated with each such bin is a voltage that will be applied to the ICs. The voltage, or data representative of the voltage, associated with each bin may be stored in a memory internal or external to the IC. A system software may be used to read the data stored in the memory to configure one or more voltage regulators, in accordance with the stored memory values, to supply the required voltages. In another embodiment, the process/speed characterization is performed on-the-fly, thereby dispensing the need for store such voltage data.

Figure 1:
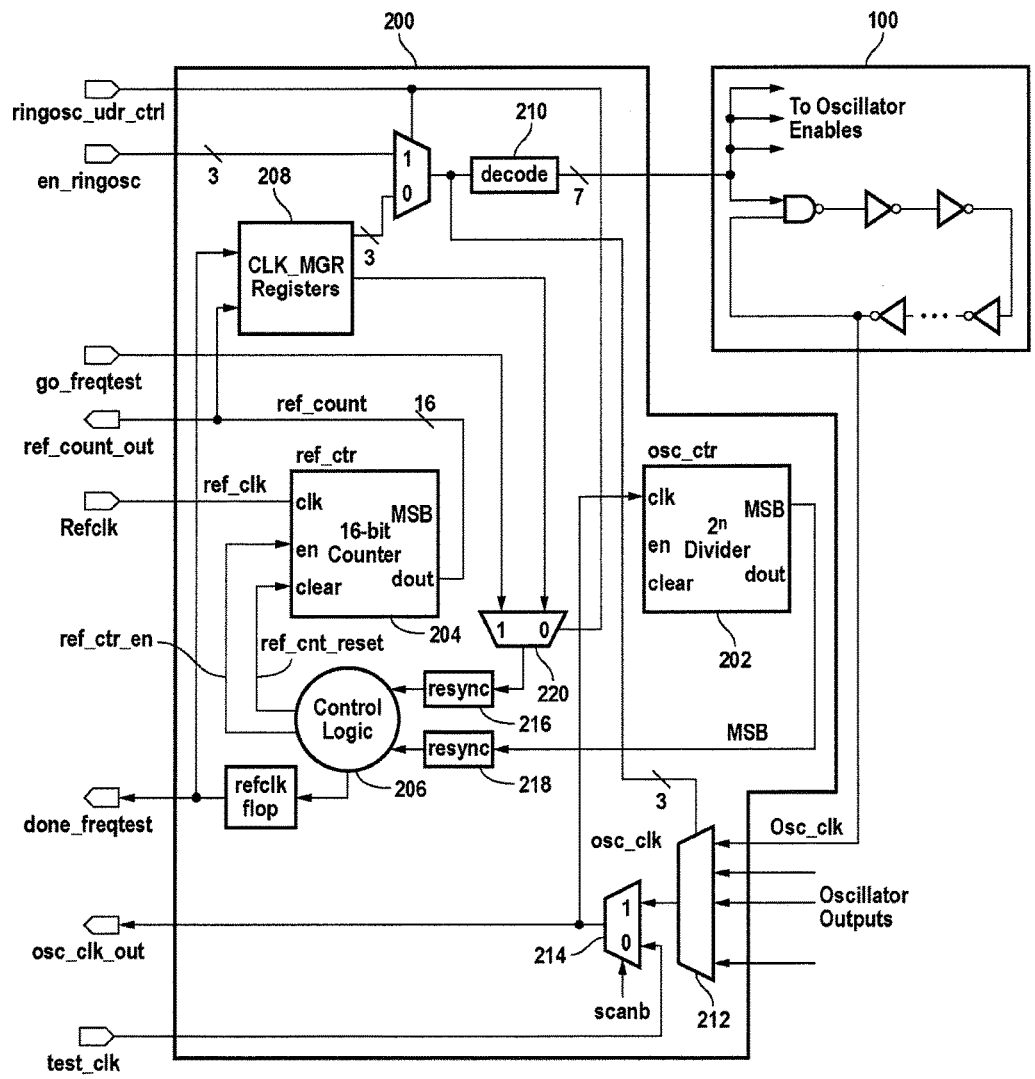
FIG. 1 is a schematic diagram of an exemplary circuit adapted to determine the process variations signature, in accordance with one embodiment of the present invention.

FIG. 1 is a schematic block diagram of a ring oscillator 100 and a test circuit 200 adapted to test and measure the operating frequency of ring oscillator 100, according to one embodiment of the present invention. Circuit 200 is shown as including, in part, a $2^N$ divider 202, an N-bit counter 204, a control logic 206 and a clock manager register 208. Circuit 200 is also shown as including, in part, a multiplexer 212 adapted to select and deliver one of the ring oscillators' output signals to multiplexer 214. Multiplexer 214 also receives test clock signal Tst_clk and delivers one of the signals it receives as an output signal Osc_clk_out. Logic blocks 216 and 218 are configured to resynchronize the signals they receive. Multiplexer 220 selectively delivers to logic block 216 one of the output of clock manager 208 or the input signal Go_freqtest.

Figure 2:
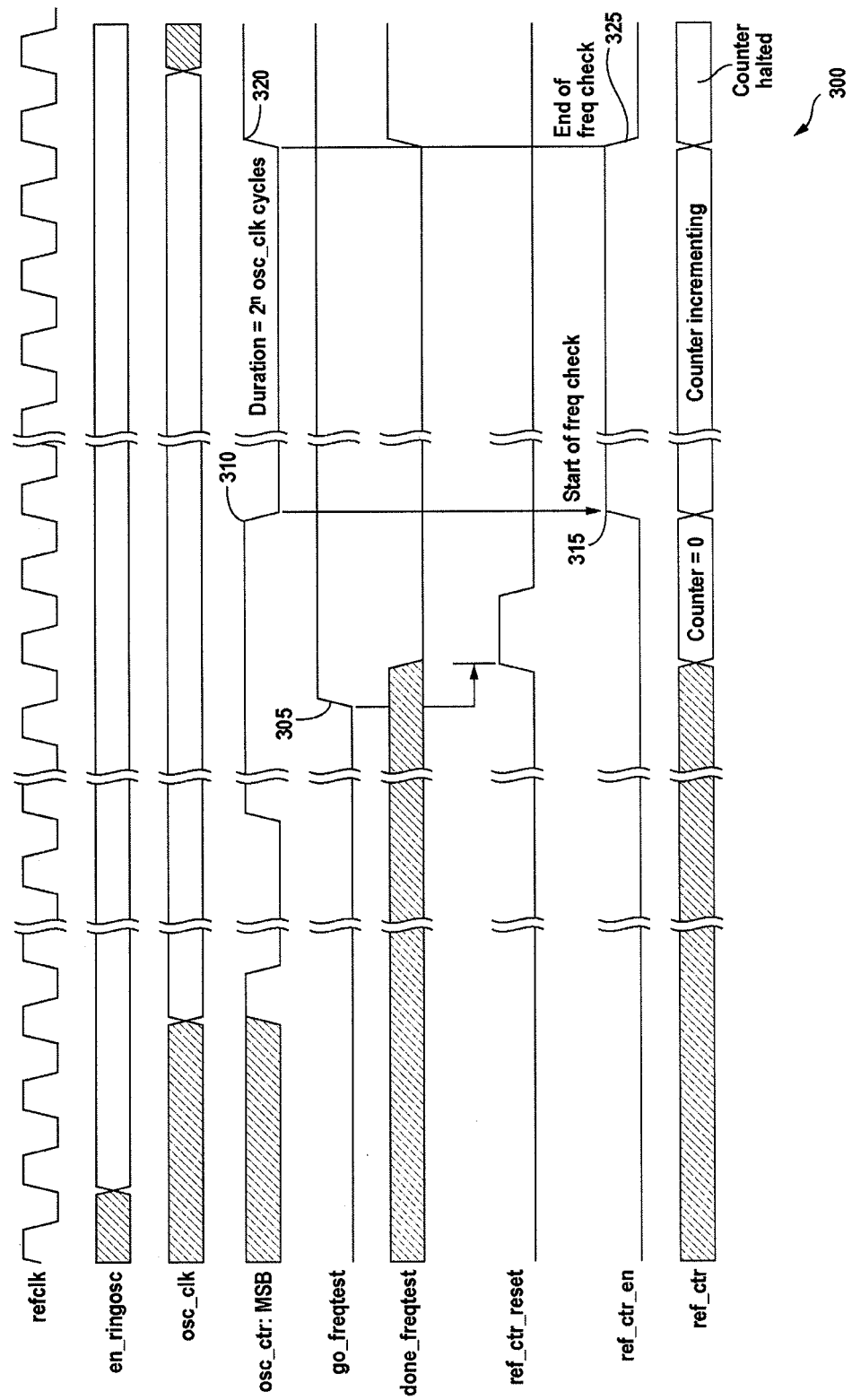
FIG. 2 is an exemplary timing diagram of a number of signal associated with the circuit of FIG. 1.

FIG. 2 shows a timing diagram of a number of signals associated with circuit 200. Signal Refclk is a reference clock signal applied to the clock input terminal Clk of counter 204. As is described further below, counter 204 is adapted to count the number of oscillations of the selected ring oscillator within a time period defined by the frequency of clock signal Refclk. Signal en_ringosc selects and enables one of the ring oscillators that are disposed along multiple critical paths of the IC being characterized. Signal Osc_clk represents the oscillating signal of the selected ring oscillator. Divider 202 divides signal Osc_clk by N (assumed to be 16 in the example shown in FIG. 1). Divider 202 receives signal Osc_clk via multiplexers 212 and 214. The frequency of the most significant bit (MSB) of divider 202 (Osc_ctr: MSB), which is defined by $$\frac{Osc\_clk}{2^N},$$

is delivered to control logic 206 via resynchronization block 218. To trigger the measurement, signal Go_freqtest is asserted 305, thereby causing a pulse to appear on signal ref_cnt_reset, which in turn, resets counter 204. Transition 310 of the MSB of signal Osc_ctr enables counter 204 to begin counting. With each transition of signal Refclk, counter 204's count is incremented. The counting continues until the next transition 320 of the MSB of signal Osc_ctr 204 causes a transition 325 in signal ref_cntr_en, in turn, disabling counter 204. The count (M) of counter 204 represents the oscillation frequency of the selected ring oscillator. The frequency $F_{osc\_clk}$ of the selected ring oscillator is defined by the following expression:

$$F_{osc\_clk} = (2^N/M) \times F_{ref\_clk}$$

where $F_{ref\_clk}$ is the frequency of the reference clock Refclk.

The user polls signal done_freqtest flag to determine when the measurement is completed. Once this flag is set, signal Ref_count_out, which represent the oscillation frequency of the selected ring oscillator, is read out. Signals done_freqtest and Ref_count_out are synchronous to the Refclk signal.

Although the above example for characterizing a circuit is described with reference to a ring oscillator, it is understood that any other suitable technique may be used. For example, in some embodiments, at-speed scan vectors may be used to determine the scan frequency and provide the performance results. At-speed scan testing is well known and is described, for example, in "High-frequency, at-speed scan testing", by Xijiiang Lin; Press, R.; Rajski, J.; Reuter, P.; Rinderknecht, T.; Swanson, B.; Tamarapalli, N.; Design & Test of Computers, IEEE, Volume 20, Issue 5, September-October 2003, pp 17-25, the content of which is incorporated herein by reference in its entirety.

Additional data related to the performance of the circuit may also be collected. For example, in some embodiments, data related to the performance of the circuit as a function of temperature are also collected for use in scaling the voltage applied to the circuits. For example, a bandgap circuit may be used to monitor the temperature characteristics of a circuit. The voltage applied to the circuit is then adjusted in accordance with its temperature characteristics. In one embodiment, data representative of the process characteristics, temperature characteristics, and the like, are stored. Such data may be stored in fuses, registers, random access memories, internal or external to the IC. During a startup phase, a software program reads the stored data and configures a voltage regulator accordingly, which in response, supplies the voltage defined by this data.

Figure 3:
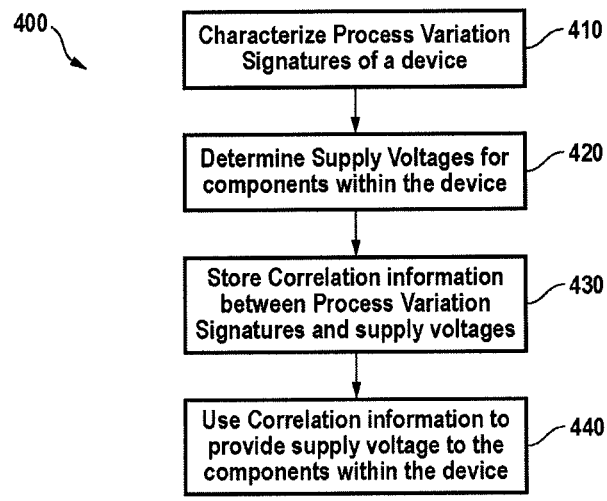
FIG. 3 is an exemplary flow chart for determining the voltage level to be applied to an IC, in accordance with one embodiment of the present invention.

FIG. 3 is a flowchart 400 for determining the voltage level to be applied to an IC, in accordance with one embodiment of the present invention. To determine this voltage, during a characterization process, the process variations signature and other parameters characteristics of the IC, such as temperature characteristics, are collected 410. The process characterization may be carried out during the manufacturing of the IC but may also be done on-the-fly or anytime thereafter. Thereafter, a correlation is established between the collected parameter values characteristics of the IC and the supply voltages. The parameter values are used to categorize the IC, or to categorize various circuit blocks within a single IC, into one or more process bins. The voltage level determined and associated 420 with each bin is thereafter applied to the IC, or to the circuit blocks of the IC, falling in that bin. The supply voltages may be either assigned on a per bin level, on a per circuit block level or a combination thereof. For example, in one embodiment, an IC may be categorized into one of three bins, namely slow, typical or fast bins. An IC categorized as falling into a slow bin would receive a supply voltage $V_{dd1}$; an IC categorized as falling into a typical bin would receive a supply voltage $V_{dd2}$ assumed to be smaller than $V_{dd1}$. An IC categorized as falling into a fast bin would receive a supply voltage $V_{dd3}$ assumed to be smaller than $V_{dd2}$. It is understood that more or fewer than 3 bins may bins may be used.

In one embodiment, the characterization data and associated supply voltages may be stored 430 in a memory, which may be external or internal to the IC. In one embodiment, the characterization data is stored in a memory internal to the IC while the associated supply voltages are stored in an external memory. During the operation of the integrated circuit, for example during a startup phase, software may read this information, determine the required supply voltage, and configure a voltage regulator to supply the required voltages to the various circuits disposed on an IC, or to various ICs disposed on a board, as illustrated in 440.

It is understood that the specific steps illustrated in FIG. 3 for reducing the power consumption in an integrated circuit correspond to an exemplary embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4:
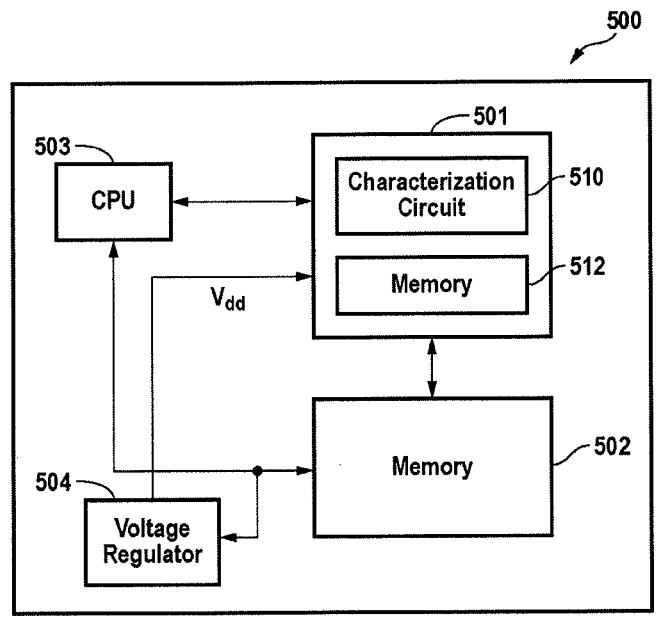
FIG. 4 is a simplified block diagram of an exemplary system that may embody the present invention.

FIG. 4 is a simplified exemplary block diagram of a system 500 that may embody the present invention. System 500 is shown as including, in part, an Integrated circuit 501, a memory 502, a central processing unit (CPU) 503, and a voltage regulator 504. IC 501 is shown as including a characterization circuit 510, and a memory 512. Characterization circuit 510 is adapted to enable measurement of various process parameters, temperature parameters, and the like, that characterize IC 501, as described above. Memory 512, disposed in IC 501, is adapted to store the characterization data and the supply voltage values that are defined by and correlate to these measurements. Such data may alternatively be stored in memory 502 that is external to IC 501. CPU 503 is configured, in part, to read the stored characterization or correlated supply voltage data and to program voltage regulator 504 accordingly. In response, programmable voltage regulator 504 supplies the voltage $V_{dd}$ to IC 501.

A number of advantages are achieved by scaling the supply voltage in accordance with the present invention. The voltage scaling in accordance with the present invention is relatively simple to implement while providing higher peak performance, lower power, and reduced device cost. The present invention does not suffer from the inherent stability problems present in conventional closed loop techniques. Since the voltage applied to an IC is correlated to its process variations signature, the amount of heat generated by the IC is less than it would be using conventional techniques, potentially dispensing the need for heat spreaders. The reduced power consumption may help reduce the die size and reduce the number of metal layers.

The above embodiments of the present invention are illustrative and not limiting. Various alternatives and equivalents are possible. Other additions, subtractions or modifications are obvious in view of the present disclosure and are intended to fall within the scope of the appended claims.

What is claimed is:

1. A method for powering an integrated circuit (IC), the method comprising:
   characterizing an IC that includes a plurality of sensors disposed along critical paths of the IC, the IC including a first sensor disposed along a critical path of a first circuit block and a second sensor disposed along a critical path of a second circuit block, the characterizing including operating the first sensor to determine a processing speed of the first circuit block and operating the second sensor to determine a processing speed of the second circuit block;
   for a plurality of processing/speed bins, each of the processing/speed bins of the plurality of processing/speed bins associated with a different range of processing speeds, the processing/speed bins including a first processing/speed bin and a second processing/speed bin, determining the first processing/speed bin to be associated with the first circuit block based upon the determined processing speed of the first circuit block;
   determining the second processing/speed bin to be associated with the second circuit block based upon the determined processing speed of the second circuit block;
   associating the first processing/speed bin with a first one of a plurality of values defined by a plurality of supply voltages;
   applying a first voltage defined by the associated first one of the plurality of values as a first supply voltage to the first circuit block of the IC during a start-up phase of the IC;
   maintaining the first voltage during an operation of the IC;
   associating the second processing/speed bin with a second one of the plurality of values defined by the plurality of supply voltages; and
   applying a second voltage defined by the associated second one of the plurality of values as a second supply voltage to the second circuit block of the IC concurrently with the application of the first voltage to the first circuit block, the second voltage different from the first voltage.

2. The method of claim 1 further comprising:
   storing the first one of the plurality of values and the second one of the plurality of values in a memory internal to the integrated circuit.

3. The method of claim 1 wherein the IC includes additional sensors and additional circuit blocks, each of the additional sensors disposed along a critical path of one of the additional circuit blocks, wherein the characterizing an IC further includes operating each of the additional sensors so as to determine a processing speed for each of the respective additional circuit blocks, the method further comprising:
   determining for each of the additional circuit blocks which one of the plurality of processing/speed bins corresponds to the determined processing speed of the particular one of the additional circuit blocks;
   applying the first voltage as a first supply voltage to those additional circuit blocks having a processing speed determined to correspond to the first processing/speed bin; and
   applying the second voltage as a second supply voltage to those additional circuit blocks having a processing speed determined to correspond to the second processing/speed bin.

4. The method of claim 3 further comprising: associating a third processing/speed bin with a third one of the plurality of values defined by a plurality of supply voltages; and
   applying a third voltage defined by the associated third one of the plurality of values as a third supply voltage to those circuit blocks of the plurality of additional circuit blocks having a processing speed determined to correspond to the third processing/speed bin, wherein the third voltage is different from the first voltage and the second voltage.

5. The method of claim 1 wherein the first sensor and the second sensor comprise ring oscillators.

6. The method of claim 1 wherein the first sensor and the second sensor comprise at-speed scan vectors.

7. The method of claim 1 wherein each of the sensors in the plurality of sensors are selected from the group consisting of a ring oscillator and an at-speed scan vector.

8. An integrated circuit comprising:
a plurality of circuit blocks including a first circuit block and a second circuit block;
a plurality of sensors disposed along critical paths of the integrated circuit, the plurality of sensors including a first sensor disposed along a critical path of the first circuit block and a second sensor disposed along a critical path of the second circuit block;
a characterization circuit coupled to each of the plurality of sensors, the characterization circuit comprising circuitry for determining a processing speed of the first circuit block and a processing speed of the second circuit block, and for associating each of the plurality of circuit blocks with one of a plurality of processing/speed bins, each of the processing/speed bins of the plurality of processing/speed bins associated with a different range of processing speeds and associated with a different voltage, the first circuit block determined to be associated with a first processing/speed bin and a first voltage, based upon the determined processing speed of the first circuit block and the second circuit block determined to be associated with a second processing/speed bin and a second voltage based upon the determined processing speed of the second circuit block;
and a voltage regulator coupled to the Characterization circuit and coupled to receive signals from the characterization circuit indicating the voltage associated with each of the plurality of circuit blocks, the voltage regulator including circuitry for applying the first voltage as a first supply voltage to the first circuit block during a start-up phase of the integrated circuit, for maintaining the first voltage during operation of the integrated circuit, and for applying the second voltage as a second supply voltage to the second circuit block of the integrated circuit concurrently with the application of the first voltage to the first circuit block.

9. The integrated circuit of claim 8, further comprising a plurality of additional circuit blocks and a plurality of additional sensors, each of the additional sensors disposed along a critical path of one of the additional circuit blocks, the characterization unit further configured for using the additional sensors for determining a processing speed of each of the respective additional circuit blocks, for associating each of the plurality of additional circuit blocks with one of the plurality of processing/speed bins; applying the first voltage as a first supply voltage to those additional circuit blocks having a processing speed determined to correspond to the first processing/speed bin and applying the second voltage as a second supply voltage to those additional circuit blocks having a processing speed determined to correspond to the second processing/speed bin.

10. The integrated circuit of claim 8, wherein the signals indicating the voltage associated with each of the plurality of circuit blocks indicate values selected from a predetermined set of a plurality of values, the plurality of values including a first value associated with the first voltage, a second value associated with the second voltage, the integrated circuit further comprising a memory for storing the plurality of values.

11. A system comprising: an integrated circuit comprising;
a plurality of circuit blocks including a first circuit block and a second circuit block;
a plurality of sensors disposed along critical paths of the integrated circuit, the plurality of sensors including a first sensor disposed along a critical path of the first circuit block and a second sensor disposed along a critical path of the second circuit block;
a characterization circuit coupled to each of the plurality of sensors, the characterization circuit comprising circuitry coupled to the plurality of sensors for determining a processing speed of the first circuit block and a processing speed of the second circuit block, and circuitry for associating each of the plurality of circuit blocks with one of a plurality of processing/speed bins, each of the processing/speed bins of the plurality of processing/speed bins associated with a different range of processing speeds and associated with a different voltage, the first circuit block determined to be associated with a first processing/speed bin and a first voltage based upon the determined processing speed of the first circuit block and the second circuit block determined to be associated with a second processing/speed bin and a second voltage based upon the determined processing speed of the second circuit block; and
a voltage regulator coupled to the characterization circuit and coupled to receive signals from the characterization circuit indicating the respective voltage associated with each of the plurality of circuit blocks, the voltage regulator including circuitry for applying the first voltage as a first supply voltage to the first circuit block during a start-up phase of the integrated circuit, for maintaining the first voltage during operation of the integrated circuit, and for applying the second voltage as a second supply voltage to the second circuit block of the integrated circuit concurrently with the application of the first voltage to the first circuit block.

12. The system of claim 11, wherein one or more of the sensors comprise ring oscillators.

13. The system of claim 11, wherein the signals indicating the voltage associated with each of the plurality of circuit blocks comprises a value of a plurality of values, each of the supply voltages associated with one of the values, the plurality of values including a first value associated with the first voltage, a second value associated with the second voltage and a third value associated with a third voltage, the system further comprising a memory for storing the first value, the second value and the third value.

14. The system of claim 11, further comprising a third processing/speed bin associated with a third voltage, the voltage regulator for applying the third voltage as a third supply voltage to those circuit blocks of the plurality of circuit blocks having a processing speed determined to correspond to the third processing/speed bin, wherein the third voltage is different from the first voltage and the second voltage.

15. The integrated circuit of claim 11, wherein at least one of the plurality of sensors comprises an at-speed scan vector.

16. The integrated circuit of claim 8, wherein the plurality of sensors comprise ring oscillators.

17. The integrated circuit of claim 8, wherein the plurality of sensors are selected from the group consisting of a ring oscillator and an at-speed scan vector.

* * * * *